United States Patent
Shimizu

[11] Patent Number: 5,610,097
[45] Date of Patent: Mar. 11, 1997

[54] METHOD FOR FORMING ELECTRODE ON SEMICONDUCTOR

[75] Inventor: Takashi Shimizu, Kashiwa, Japan

[73] Assignee: Agency of Industrial Science & Technology, Ministry of International Trade & Industry, Tokyo, Japan

[21] Appl. No.: 615,106

[22] Filed: Mar. 14, 1996

[30] Foreign Application Priority Data

Mar. 24, 1995 [JP] Japan ................................. 7-065561

[51] Int. Cl.$^6$ ................................................. H01L 21/44
[52] U.S. Cl. ..................... 437/175; 437/176; 437/179; 437/39; 148/DIG. 139; 148/DIG. 140
[58] Field of Search ............................... 437/175, 176, 437/179, 177, 184, 185, 39; 148/DIG. 139, DIG. 140

[56] References Cited

U.S. PATENT DOCUMENTS 5,006,483  4/1991  Ohtsuka et al. ................. 437/179
5,221,638  6/1993  Ohtsuka et al. ................. 437/175

FOREIGN PATENT DOCUMENTS 0209196  1/1987  European Pat. Off. ........... 437/175
0304073  2/1989  European Pat. Off. ........... 437/176

*Primary Examiner*—Tuan H. Nguyen
*Attorney, Agent, or Firm*—Oblon, Spivak, McClelland, Maier & Neustadt, P.C.

[57] ABSTRACT

A method for forming electrodes on a semiconductor includes introducing at least one reactive oxidizing gas selected from the group consisting of ozone, atomic oxygen, nitrogen dioxide, oxygen ion and oxygen plasma to an oxide semiconductor surface and depositing electrode material on the oxide semiconductor surface without exposing the surface to the outside atmosphere.

2 Claims, 3 Drawing Sheets

5,610,097

METHOD FOR FORMING ELECTRODE ON SEMICONDUCTOR

BACKGROUND OF THE INVENTION

1. Field of the Invention

The present invention relates to a method and apparatus for forming electrodes on an oxide semiconductor wherein the electrical properties of the surface of the oxide semiconductor are improved by preventing formation of junctions between the oxide and electrode material being accompanied by desorption of oxygen from the oxide.

2. Description of the Prior Art

There are two conventional methods used for forming junctions between oxide semiconductor and electrode material on the semiconductor. One method is used to form a junction with bulk oxide semiconductor, and consists of using acid or the like to chemical etch the oxide surface, placing the sample in a vacuum chamber and depositing the electrode material. The other method is used when a junction is to be formed with a thin film of oxide semiconductor, and consists of forming the oxide semiconductor in an oxide film forming apparatus, and then, without subjecting the oxide surface to any particular treatment, moving the sample into an electrode deposition apparatus to form the electrodes. An advantage of these methods is that they facilitate the formation of junctions between oxides and electrode material without the use of special techniques.

However, a major drawback with each of the above methods is that prior to the deposition of electrode material, the oxide surface is exposed to the atmosphere, and as a result the electrical properties of the oxide surface are degraded by carbon dioxide and other such substances in the atmosphere. Thus, the functions of devices using such junctions between oxide semiconductors and electrode material fabricated by the above conventional methods are considerably inferior to devices using junctions between conventional semiconductor and electrode material.

An object of the present invention is to provide a method and apparatus that enables electrodes having superior electrical properties to be formed on oxide semiconductor.

SUMMARY OF THE INVENTION

In accordance with this invention, the above object is attained by a method for forming electrodes on a semiconductor, comprising introducing at least one reactive oxidizing gas selected from the group consisting of ozone, atomic oxygen, nitrogen dioxide, oxygen ion and oxygen plasma to an oxide semiconductor surface and depositing electrode material on the oxide semiconductor surface without atmospheric exposure of the surface.

The above object is also attained by an apparatus for forming electrodes on semiconductor, comprising a deposition apparatus for deposition formation of electrode material on an oxide semiconductor surface in a vacuum chamber, and a gas supply apparatus that introduces reactive oxidizing gas into the deposition apparatus for contact with at least a surface of the oxide semiconductor on which electrode material is to be deposited.

Since conventional electrode forming apparatuses do not have a reactive oxidizing gas supply apparatus, the degraded surface layer of the oxide semiconductor had to be removed either by evaporation by heating the sample to a high temperature in a vacuum chamber, or by irradiation with a high-energy ion beam. In both methods, the removal of the degraded layer is accompanied by oxygen desorption from the oxide semiconductor sample itself, which in practice has made it difficult to form good electrodes. In the case of the present invention, moreover, reactive oxidizing gas is brought into contact with the oxide semiconductor surface that in the conventional arrangement is degraded by contact with the atmosphere. This contact with the reactive oxidizing gas enables heat treatment to be effected at a lower temperature, enabling the electrical properties of the sample surface to be improved without desorption of oxygen from the oxide semiconductor.

Further features of the invention, its nature and various advantages will be more apparent from the accompanying drawings and following detailed description of the invention.

DESCRIPTION OF THE PREFERRED EMBODIMENT

The present invention provides a method comprising the steps of supplying reactive oxidizing gas onto the surface of an oxide semiconductor to improve the electrical properties of the surface and then depositing an electrode material on the surface of the oxide semiconductor.

As the reactive oxidizing gas, this invention uses ozone, atomic oxygen, nitrogen dioxide, oxygen ion or oxygen plasma, singly or in a combination of two or more. When such a gas having a more powerful oxidizing property than oxygen is used, it becomes possible to remove carbon-based compounds adsorbed on the surface of oxides at a contact temperature of from room temperature to about 500° C. under a high vacuum of $10^{-4}$ Torr or below. Since the reactivity of the reactive oxidizing gas increases with increasing temperature, a higher contact temperature reduces damage to the oxide surface layer, shortening the contact time required to improve the oxide surface properties. For example, four to five hours are required for the improvement at a contact temperature of room temperature, whereas one hour will suffice at a contact temperature of 400° C. to 500° C. A high-temperature process of over 500° C. increases the diffusion effect and, when fabricating a device having a plurality of interfaces, the unnecessary interfacial diffusion can cause severe degradation of device characteristics. In accordance with this invention in which reactive oxidizing gas is used, oxide surface properties can be improved in a high-vacuum process at a low temperature of not more than 500° C. and, as a result, the time required from surface cleaning to electrode formation is reduced, and degradation of surface properties through contact with carbon dioxide or the like prior to electrode formation by the electrode deposition apparatus can be prevented.

Figure 1:
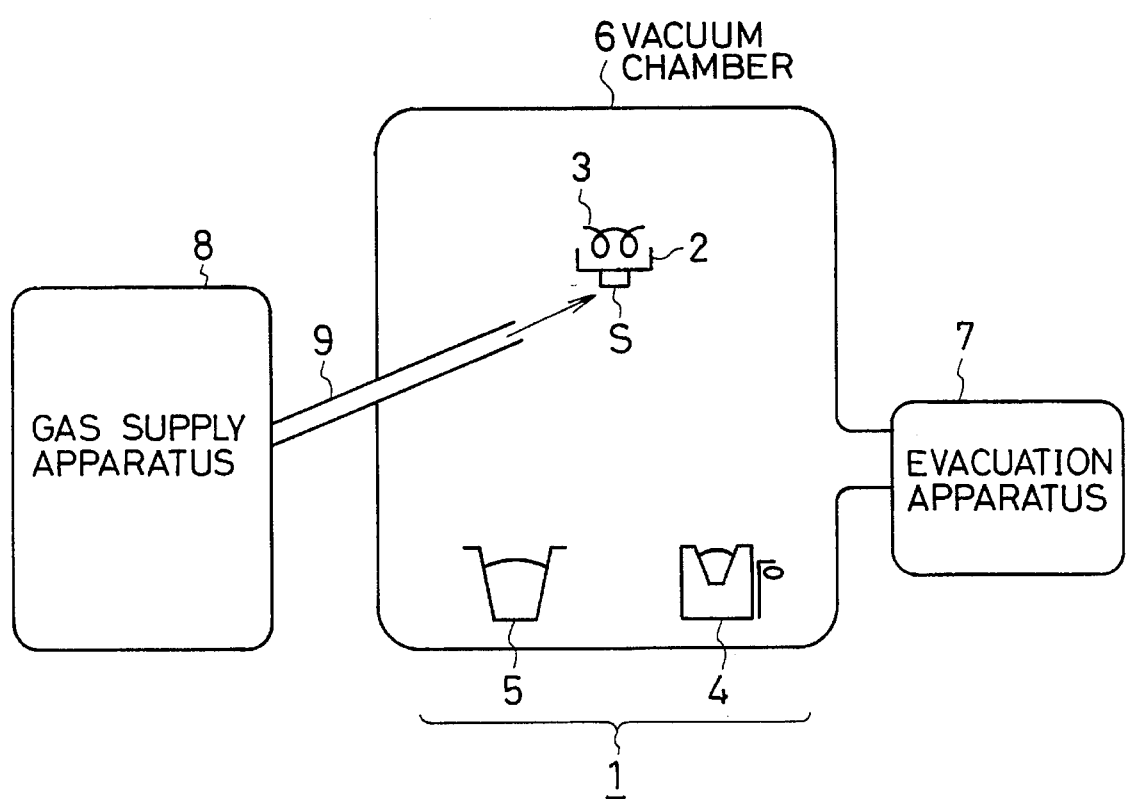
FIG. 1 shows the configuration of an embodiment of the electrode formation apparatus according to the present invention.

FIG. 1 shows the configuration of an embodiment of the electrode formation apparatus for carrying out the aforementioned method. As shown, the apparatus comprises an electrode material deposition apparatus 1, a sample stage 2, a sample heater 3, an electron-gun type electrode material deposition source 4, a resistance-heating type electrode material deposition source 5, a vacuum chamber 6, and an evacuation apparatus 7 for evacuating the vacuum chamber 6. The arrangement up to this point is the same as a conventional one. A gas supply apparatus 8 supplies the vacuum chamber 6, via a pipe 9, with a controlled amount of a reactive oxidizing gas such as ozone. S denotes an oxide semiconductor fixed to the sample stage 2. A valve and a control section for controlling the flow of the reactive oxidizing gas through the pipe 9 are omitted in FIG. 1. Also, although the arrangement in FIG. 1 is provided with an electron-gun type electrode material deposition source 4 and a resistance-heating type electrode material deposition source 5, either of these can be used for both purposes.

A high-purity ozone supplier may be used as the oxidizing gas supply apparatus 8. The high-purity ozone supplier is able to supply the vacuum chamber 6 with a high-purity ozone flux of $10^{15}$ to $10^{17}$ molecules/cm$^2$ at a pressure of $10^{-7}$ to $10^{-5}$ Torr. Therefore, deposition of the electrode material can be effected after reducing the pressure in the vacuum chamber 6 to $10^{-8}$ Torr or below as soon as the ozone has cooled the oxide down to a temperature at which there is no desorption of oxygen from the sample. Moreover, when the electrode material is a substance such as gold that is not readily oxidized, the deposition can be carried out in a reactive oxidizing gas atmosphere.

Two examples will now be described. In one example, gold electrodes were formed on SrTiO$_3$ as the oxide semiconductor, and in the other gold electrodes were formed on TiO$_2$ as the oxide semiconductor. Schottky junctions of Nb-doped SrTiO$_3$ and gold and Nb-doped TiO$_2$ and gold fabricated by the electrode formation method of this invention and by a conventional method, and were compared to evaluate the electrical characteristics.

The vacuum deposition of gold electrodes on SrTiO$_3$ in accordance with an embodiment of this invention will now be described. Nb-doped SrTiO$_3$ is a known n-type oxide semiconductor. Samples of optically-ground single crystal SrTiO$_3$ doped with Nb at 0.01% were etched by nitric acid, heated at 1000° C. for 1 hour for flattening treatment and further heated at 400° C. for 4 hours in flowing oxygen for annealing treatment. The samples thus treated, when viewed using an atomic force microscope, were found to have a flat and neat surface even in the atmosphere.

The flattening treatment can be achieved by etching samples by hydrofluoric acid with its pH adjusted, for example.

Figure 2:
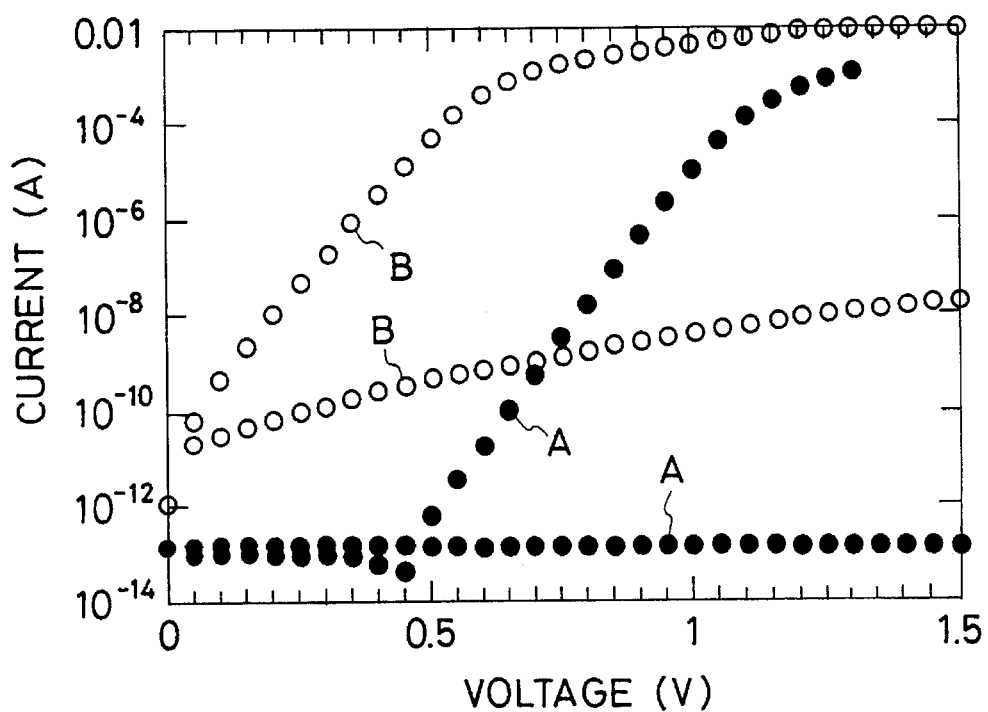
FIG. 2 is a graph showing the current-voltage characteristics of n-type $SrTiO_3$ oxide semiconductor Schottky diodes formed in accordance with this invention and by prior art methods.

The samples with their surfaces thus flattened were placed on the sample stage 2 inside the vacuum chamber 6 of the electrode material deposition apparatus 1 and exposed to ozone introduced through the pipe 9 from the gas supply apparatus 8 to form an ozone atmosphere having a pressure of $3\times10^{-5}$ Torr. The oxide samples were heated by the heater 3 in this atmosphere to 400° C. to 500° C. for about 1 hour to improve the electrical properties of the surface, and were then cooled to 100° C. or below. Gold electrodes were then formed in the ozone atmosphere by the electron-gun type electrode material deposition source 4 to form Schottky electrodes. The size of each electrode was $2\times10^{-3}$ cm$^2$. Aluminum was deposited on the reverse side to form an ohmic contact electrode. In FIG. 2, the solid bullet curves denoted by "A" show the current-voltage characteristics of the Schottky diodes thus formed. The forward current I of the Schottky junction at a forward bias V is represented as $$I\alpha\exp(eV/nkT)$$

where e is elementary electric charge, k is Boltzmann constant, and T is temperature, n is a numerical value termed an ideality factor; it is a temperature-dependent value between 1 and 2, but in the case of conventional semiconductors such as silicon and gallium arsenide, it is nearly 1. In the case of the forward current-voltage characteristics "A" of FIG. 2, n was 1.16, which, among current-voltage characteristics obtained so far with Schottky diodes formed using Nb-doped n-type SrTiO$_3$, is the closest to 1. That is to say, it was this invention that enabled this outstanding forward current-voltage characteristic to be achieved for the first time.

The open bullet curves "B" in FIG. 2 indicate current-voltage characteristics obtained with Schottky electrodes formed by directly depositing the gold on the above ozone-treated SrTiO$_3$ doped with Nb at 0.01% under a vacuum pressure of $10^{-7}$ Torr and depositing aluminum on the reverse side to form ohmic electrodes, without using the ozone heating treatment of the conventional method. The size of each electrode was $2\times10^{-3}$ cm$^2$. In the case of the forward current-voltage characteristics "B" of FIG. 2, n was 1.24, larger than in the case of A. The greatest difference between the curves "A" and "B" shown in FIG. 2 was in the magnitude of the leak current under reverse bias conditions. At a reverse bias of $-1.5$ volts, leak current was in the order of $10^{-8}$ A in the case of curves "B", while in the case of "A" the leak current was below $10^{-12}$ A, a value substantially the same as the leak current of the measurement system. A Schottky diode fabricated by the method of the present invention exhibited a leak current of $1\times10^{-11}$ A at a reverse bias of $-8$ volts. This is the smallest leak current so far reported, and was therefore first achieved by this invention.

Figure 3:
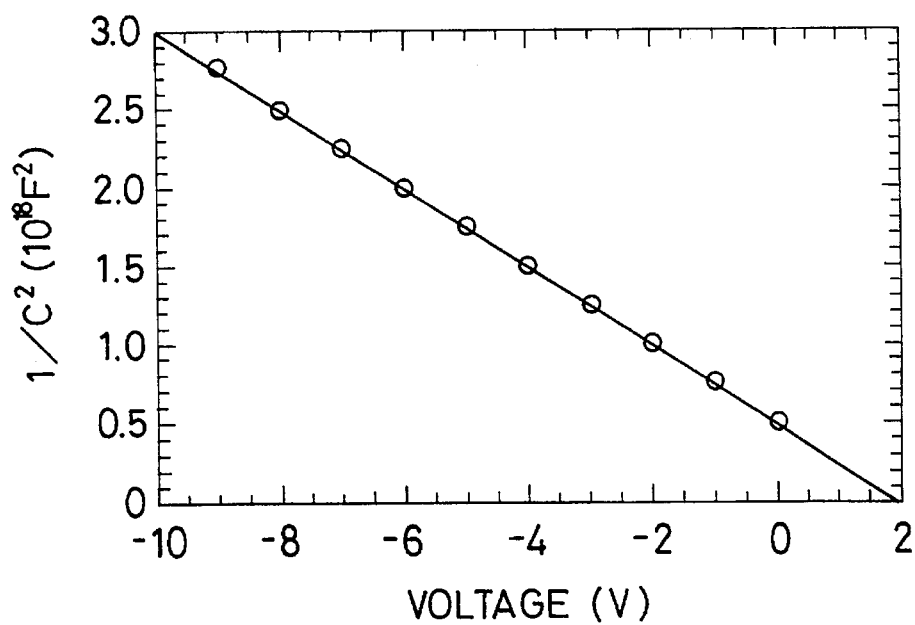
FIG. 3 is a graph showing the capacitance-voltage characteristics of an n-type $SrTiO_3$ oxide semiconductor Schottky diode formed in accordance with this invention.

Schottky junction capacitance value $C^{-2}$ exhibits a linear voltage dependency characteristic corresponding to the thickness of the depletion layer. FIG. 3 shows the capacitance $C^{-2}$ voltage dependency characteristic under a reverse bias condition, in a Schottky diode fabricated in accordance with the method of this invention. A linear voltage dependency can be observed down to below $-8$ volts. In samples exhibiting a large leak current that were not subjected to ozone heating, there is a loss of linearity from $-1$ volt (not shown). This also is a clear indication of the superior characteristics of Schottky diodes fabricated in accordance with this invention.

While in the above embodiment the oxide sample was heated to 400° C. to 500° C., with ozone applied to the surface of the oxide sample, it was confirmed that substantially the same results could be obtained even when the oxide sample was kept under room temperature.

Figure 4:
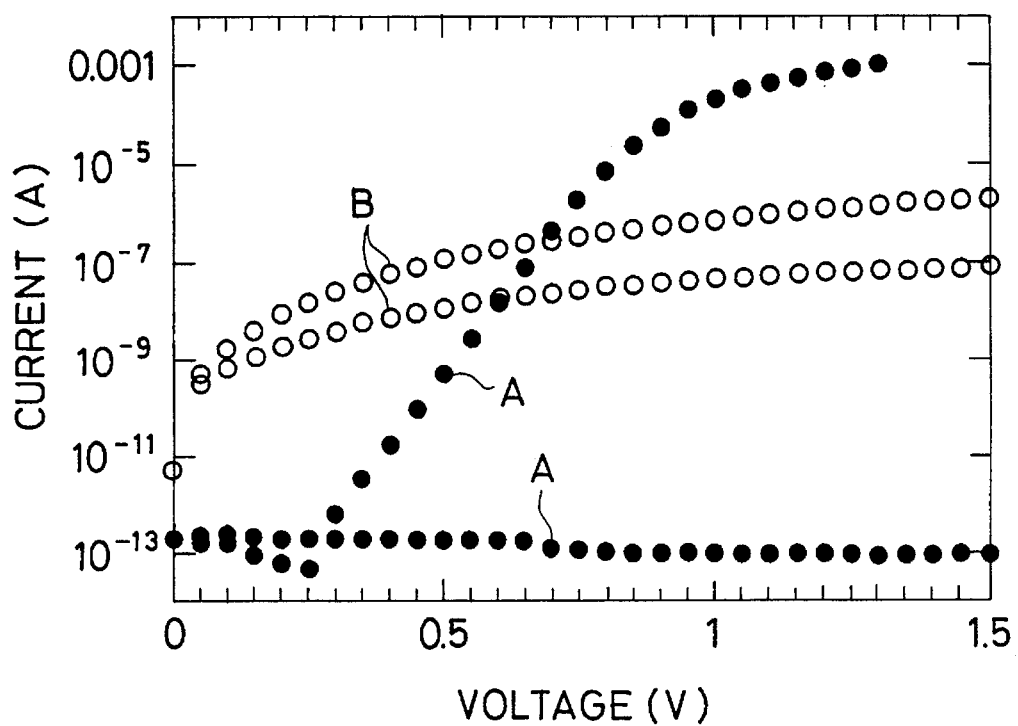
FIG. 4 is a graph showing the capacitance-voltage characteristics of n-type $TiO_2$ oxide semiconductor Schottky diodes formed in accordance with this invention and by a prior art method.

The vacuum deposition of gold electrodes on TiO$_2$ in accordance with an embodiment of this invention will now be described. Samples of optically-ground single crystal TiO$_2$ doped with Nb at 0.01% were etched with nitric acid, heated at 1000° C. for 1 hour for flatenning treatment and at 400° C. for 4 hours in oxygen. The samples were then placed in the electrode material deposition apparatus 1 and exposed to ozone introduced from the gas supply apparatus 8 to form an ozone atmosphere having a pressure of $3\times10^{-5}$ Torr. The oxide samples were heated in this atmosphere to 400° C. to 500° C. for about 1 hour for improvement in electrical properties of the surface and cooled to 100° C. or below, and this was followed by deposition of the gold electrodes in the ozone atmosphere. The size of these Schottky electrodes was $2\times10^{-3} cm^2$. The resistance-heating type electrode material deposition source 5 was used to deposit aluminum on the reverse side. In FIG. 4, the solid bullet curves denoted by "A" show the current-voltage characteristics of the Schottky diodes thus formed. The forward bias current n value was 1.27. Although this is slightly larger than in the case of $SrTiO_3$, the reverse bias leak current is a low $10^{-12}$ A or below at −1.5 volts.

Figure 5:
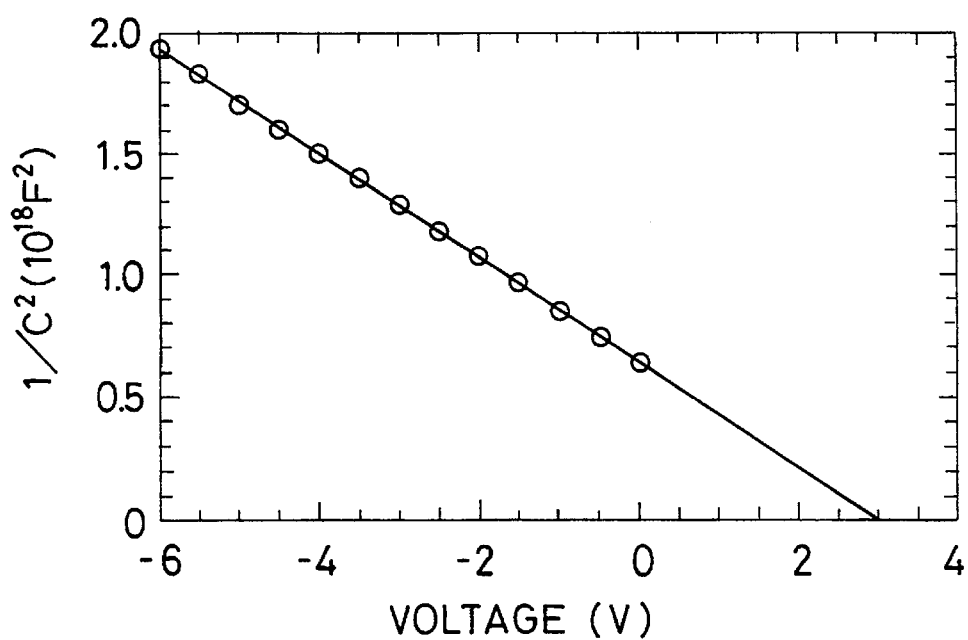
FIG. 5 is a graph showing the voltage dependency characteristic of the capacitance $C^{-2}$ value in an n-type $TiO_2$ oxide semiconductor Schottky diode formed in accordance with this invention.

A comparison with the current-voltage characteristics of Schottky diodes fabricated by a conventional method, represented by the open bullet curves "B" in FIG. 4, reveal that under both forward and reverse bias conditions, Schottky diodes fabricated according to the present invention exhibit far better characteristics. The reverse bias leak current in n-type $TiO_2$ Schottky diodes fabricated according to the present invention was $9\times10^{-12}$ A at −8 volts. As can be seen in FIG. 5, in Schottky diodes fabricated in accordance with this invention the capacitance $C^{-2}$ value exhibits a linear voltage dependency characteristic, in contrast to diodes fabricated by a conventional method, which exhibit nonlinear voltage dependency.

As described in the foregoing, it was established that in accordance with this invention, with $SrTiO_3$ and $TiO_2$ as the oxide semiconductors, electrodes could be formed exhibiting excellent electrical characteristics. While in the above embodiments ozone was used as the oxidizing gas, atomic oxygen, nitrogen dioxide, oxygen ion or oxygen plasma may be used instead, either alone or in a combination of two or more.

The electrode formation method according to the present invention comprises introducing one or multiple oxidizing reactive oxidizing gases selected from ozone, atomic oxygen, nitrogen dioxide, oxygen ion and oxygen plasma onto the surface of an oxide semiconductor, and directly forming electrodes on the oxide semiconductor by deposition of the electrode material, without subjecting the oxide semiconductor surface to exposure to the atmosphere. This makes it possible to produce oxide semiconductor based Schottky diodes having a forward bias current n value of 1 and a reverse bias leak current of $1\times10^{-11}$ A or below at −8 volts. The method of the invention can also be used to form current and voltage contacts with excellent electrical characteristics.

The electrode formation apparatus of the invention comprises an apparatus for deposition formation of electrode material on an oxide semiconductor surface in a vacuum chamber, and a gas supply apparatus that introduces reactive oxidizing gas into the deposition apparatus for contact with at least a surface of the oxide semiconductor on which the electrode material is to be deposited. Thus, the whole apparatus may be newly configured throughout, or it may be readily configured by adding an oxidizing gas supplier to an existing electrode formation apparatus.

What is claimed is:

1. A method for forming electrodes on a semiconductor, comprising introducing at least one reactive oxidizing gas selected from the group consisting of ozone, atomic oxygen, nitrogen dioxide, oxygen ion and oxygen plasma to an oxide semiconductor surface and depositing electrode material on the oxide semiconductor surface without atmospheric exposure of the surface.

2. A method according to claim 1, further comprising contacting electrode material with the reactive oxidizing gas at a temperature of from room temperature to 500° C.

* * * * *